United States Patent
Furukawa et al.

(10) Patent No.: US 7,691,720 B2
(45) Date of Patent: Apr. 6, 2010

(54) VERTICAL NANOTUBE SEMICONDUCTOR DEVICE STRUCTURES AND METHODS OF FORMING THE SAME

(75) Inventors: Toshiharu Furukawa, Essex Junction, VT (US); Mark Charles Hakey, Fairfax, VT (US); Steven John Holmes, Guilderland, NY (US); David Vaclav Horak, Essex Junction, VT (US); Charles William Koburger, III, Delmar, NY (US); Peter H. Mitchell, Jericho, VT (US); Larry Alan Nesbit, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 96 days.

(21) Appl. No.: 11/926,661

(22) Filed: Oct. 29, 2007

(65) Prior Publication Data

US 2008/0227264 A1    Sep. 18, 2008

Related U.S. Application Data

(62) Division of application No. 10/767,065, filed on Jan. 29, 2004.

(51) Int. Cl.
*H01L 21/76* (2006.01)

(52) U.S. Cl. .................. 438/413; 438/268; 438/270; 257/E21.476; 257/E21.581; 977/700; 977/734; 977/742

(58) Field of Classification Search .......... 438/413, 438/268, 270, 622; 257/E21.476, E21.581; 977/700, 734, 742
See application file for complete search history.

(56) References Cited

U.S. PATENT DOCUMENTS 5,796,573  A    8/1998    Kotecki et al.

(Continued)

FOREIGN PATENT DOCUMENTS

EP    1331671 A1    7/2003

(Continued)

OTHER PUBLICATIONS

"IBM Scientists Develop Carbon Nanotube Transistor Technology," IBM.com News, news report concerning work published in Science, vol. 292, Issue 5517, Apr. 27, 2001 entitled "Engineering Carbon Nanotubes and Nanotube Circuits Using Electrical Breakdown" by Avouris, et al. (3 pages).

(Continued)

*Primary Examiner*—Alexander G Ghyka
*Assistant Examiner*—Abdulfattah Mustapha
(74) *Attorney, Agent, or Firm*—Wood, Herron & Evans, LLP

(57) ABSTRACT

Vertical device structures incorporating at least one nanotube and methods for fabricating such device structures by chemical vapor deposition. Each nanotube is grown by chemical vapor deposition catalyzed by a catalyst pad and encased in a coating of a dielectric material. Vertical field effect transistors may be fashioned by forming a gate electrode about the encased nanotubes such that the encased nanotubes extend vertically through the thickness of the gate electrode. Capacitors may be fashioned in which the encased nanotubes and the corresponding catalyst pad bearing the encased nanotubes forms one capacitor plate.

17 Claims, 5 Drawing Sheets

U.S. PATENT DOCUMENTS

| | | | |
|---|---|---|---|
| 6,097,138 | A | 8/2000 | Nakamoto |
| 6,250,984 | B1 | 6/2001 | Jin et al. |
| 6,423,583 | B1 | 7/2002 | Avouris et al. |
| 6,515,325 | B1 | 2/2003 | Farnworth et al. |
| 6,566,704 | B2 | 5/2003 | Choi et al. |
| 6,599,808 | B2 | 7/2003 | Kim et al. |
| 6,740,910 | B2 | 5/2004 | Roesner et al. |
| 6,815,294 | B2 | 11/2004 | Choi et al. |
| 6,858,891 | B2 | 2/2005 | Farnworth et al. |
| 6,891,227 | B2 | 5/2005 | Appenzeller et al. |
| 7,015,500 | B2 | 3/2006 | Choi et al. |
| 7,038,299 | B2 | 5/2006 | Furukawa et al. |
| 7,211,844 | B2 | 5/2007 | Furukawa et al. |
| 2002/0001905 | A1* | 1/2002 | Choi et al. .................. 438/268 |
| 2002/0125805 | A1* | 9/2002 | Hsu ........................... 313/309 |
| 2002/0163079 | A1 | 11/2002 | Awano |
| 2003/0168683 | A1 | 9/2003 | Farnworth et al. |
| 2003/0227015 | A1 | 12/2003 | Choi et al. |
| 2005/0056826 | A1 | 3/2005 | Appenzeller et al. |
| 2005/0129948 | A1 | 6/2005 | Furukawa et al. |
| 2005/0167755 | A1 | 8/2005 | Dubin et al. |
| 2005/0179029 | A1 | 8/2005 | Furukawa et al. |

FOREIGN PATENT DOCUMENTS

| | | |
|---|---|---|
| EP | 1361608 A2 | 11/2003 |
| EP | 1420414 A1 | 11/2003 |
| EP | 1435660 A2 | 7/2004 |
| WO | 03063208 A2 | 7/2003 |
| WO | 2004040616 A2 | 5/2004 |
| WO | 2004040668 A2 | 5/2004 |
| WO | 2004105140 A1 | 12/2004 |

OTHER PUBLICATIONS

"Carbon Nanotube Arrays: Synthesis of Dense Arrays of Well-Aligned Carbon Nanotubes Completely Filled with Titanium Carbide on Titanium Substrates," Batelle No. 12132 (1 page).

Cao, et al., "Grapevine-like Growth of Single Walled Carbon Nanotubes Among Vertically Aligned Multiwalled Nanotube Arrays", Applied Physics Letters vol. 79, No. 9, Aug. 27, 2001 (pp. 1252-1254).

Chang, "Integration of Nanotubes into Devices", National Nanofabrication Users Network, Stanford Nanofabrication Facility, p. 58.

Choi, et al., "Ultrahigh-Density Nanotransistors by Using Selectively Grown Vertical Carbon Nanotubes", Applied Physics Letters, vol. 79, No. 22, Nov. 26, 2001, pp. 3696-3698.

Collins, et al., "Nanotubes for Electronics," Scientific American, Dec. 2000, pp. 62-69.

Collins, et al., "Engineering Carbon Nanotubes and Nanotube Circuits Using Electrical Breakdown," Science, vol. 292, Apr. 27, 2001, pp. 706-709.

Cui, et al., "Growth Behavior of Carbon Nanotubes on Multilayered Metal Catalyst Film in Chemical Vapor Deposition," Chemical Physics Letters 374 (2003), pp. 222-228.

Derycke, et al., "Carbon Nanotube Inter- and Intramolecular Logic Gates," Nano Letters, xxxx, vol. 0, No. 0, A-D, received Aug. 16, 2001 (4 pages).

Duesberg, et al., "Ways Toward the Scaleable Integration of Carbon Nanotubes into Silicon Based Technology", Diamond and Related Materials 13 (2004) pp. 354-361.

Duesberg, et al., "Large-Scale Integration of Carbon Nanotubes into Silicon Based Microelectronics", Proceedings of SPIE vol. 5118 (2003), pp. 125-137.

Gorman, "Nanoscale Networks: Superlong Nanotubes Can Form a Grid," Science News Online, week of May 3, 2003, vol. 163, No. 18. (3 pages).

Harris, "Carbon Nanotubes and Related Structures," Cambridge University Press, 1999 (pp. 15-60).

Huang, et al. "Growth of Highly Oriented Carbon Nanotubes by Plasma-Enhanced Hot Filament Chemical Vapor Deposition", Applied Physics Letters, vol. 73, No. 26, Dec. 28, 1998, pp. 3845-3847.

Jung, et al., "Growth of Carbon Nanotubes by Chemical Vapor Deposition", Diamond and Related Materials 10 (2001) pp. 1235-1240.

Kalaugher, "Tiny Nanotubes Set New Record," Nanotechweb.org, Aug. 7, 2003 (1 page).

Kiang, "Growth of Large-Diameter Single-Walled Carbon Nanotubes," J. Phys. Chem. A 2000, 104, 2454-2456.

Li, et al., "Highly-Ordered Carbon Nanotube Arrays for Electronics Applications," Applied Physics Letters, vol. 75, No. 3, Jul. 19, 1999, pp. 367-369.

Li, et al., "Bottom-Up Approach for Carbon Nanotube Interconnects," NASA Ames Research Center, received Dec. 5, 2002, accepted Jan. 31, 2003 (1 page).

Mo, et al, "The Growth Mechanism of Carbon Nanotubes from Thermal Cracking of Acetylene Over Nickel Catalyst Supported on Alumina," Synthetic Metals 122 (2001) pp. 443-447.

Ploenjes, et al., "Single-Walled Carbon Nanotube Synthesis in CO Laser Pumped Carbon Monoxide Plasmas," Ohio State University, Oct. 10, 2001 (1 page).

Plonjes, et al., "Synthesis of Single-Walled Carbon Nanotubes in Vibrationally Non-Equilibrium Carbon Monoxide," Chemical Physics Letters 352 (2002) pp. 342-347.

Popov, "Carbon Nanotubes: Properties and Application", Materials Science and Engineering R. vol. R43, No. 3, pp. 61-102, Jan. 15, 2004 (1 page).

Ren, et al., "Synthesis of Large Arrays of Well-Aligned Carbon Nanotubes on Glass," Science, vol. 282, Nov. 6, 1998, pp. 1105-1107.

Ren, et al., "Large Arrays of Well-Aligned Carbon Nanotubes," Proceedings of 13th International Winter School on Electronic Properties of Novel Materials, pp. 263-267, Feb. 27-Mar. 6, 1999, Kirchberg / Tirol, Austria.

Ren, et al., "Growth, Characterization, and Potential Applications of Periodic Carbon Nanotube Arrays," Department of Physics, Boston College, updated 2001 (2 pages).

Zhu, et al., "Direct Synthesis of Long Single-Walled Carbon Nanotube Strands," Science, vol. 296, May 3, 2002, pp. 884-886.

Teo, "Catalytic Synthesis of Carbon Nanotubes and Nanofibers," Encyclopedia of Nanoscience and Nanotechnology, vol. X, pp. 1-22, 2003.

Wind, et al., "Vertical Scaling of Carbon Nanotube Field-Effect Transistors Using Top Gate Electrodes," Applied Physics Letters, vol. 80, No. 20, May 20, 2002, pp. 3817-3819.

"Synthesis of CNT's," http://nepp.nasa.gov/index— nasa.cfm/769/#synthesis (7 pages).

Zhang, et al., "Electric-Field-Directed Growth of Aligned Single-Walled Carbon Nanotubes," Applied Physics Letters, vol. 79, No. 19, Nov. 5, 2001, pp. 3155-3157.

Zhao, et al., "Film Growth of Pillars of Multi-Walled Carbon Nanotubes," J. Phys.: Condens., Matter 15 (2003), L565-L569.

Zheng, et al., "Efficient CVD Growth of Single-Walled Carbon Nanotubes on Surfaces Using Carbon Monoxide Precursor," Nano Letters, xxxx, vol. 0., No. 0, A-D, xxxx American Chemical Society, received Jun. 4, 2002, revised Jun. 26, 2002, (3 pages).

USPTO, Office Action in related U.S. Appl. No. 10/767,065 dated Dec. 7, 2009.

* cited by examiner

VERTICAL NANOTUBE SEMICONDUCTOR DEVICE STRUCTURES AND METHODS OF FORMING THE SAME

CROSS-REFERENCE TO RELATED APPLICATIONS

This application is a divisional of application Ser. No. 10/767,065, filed Jan. 29, 2004, which is hereby incorporated by reference herein in its entirety.

FIELD OF THE INVENTION

The invention relates to semiconductor device fabrication and, more particularly, to vertical semiconductor device structures, such as field effect transistors and capacitors, incorporating nanotubes as a device element and methods of fabricating such vertical semiconductor device structures.

BACKGROUND OF THE INVENTION

Traditional field effect transistors (FET's) are familiar conventional devices commonly incorporated as a fundamental building block into the intricate circuitry of integrated circuit (IC) chips. A single IC chip may feature many thousands to millions of FET's, along with other passive components such as resistors and capacitors, interconnected by conductive paths. FET's operate by varying the resistivity of a channel in a channel region separating a source and a drain. Carriers flow from the source to the drain through the channel in proportion to the variation in electrical resistivity. Electrons are responsible for channel conduction in n-channel FET's and, in p-channel FET's, holes are responsible for conduction in the channel. The output current of the FET is varied by application of a voltage to an electrostatically-coupled gate electrode located above the channel region between the source and drain. A thin gate dielectric insulates the gate electrode electrically from the channel region. A small change in gate voltage can cause a large variation in the current flowing from the source to the drain.

FET's can be classified into horizontal architectures and vertical architectures. Horizontal FET's exhibit carrier flow from source to drain in a direction parallel to the horizontal plane of the substrate on which they are formed. Vertical FET's exhibit carrier flow from source to drain in a direction vertical to the horizontal plane of the substrate on which they are formed. Because channel length for vertical FET's does not depend on the smallest feature size resolvable by lithographic equipment and methods, vertical FET's can be made with a shorter channel length than horizontal FET's. Consequently, vertical FET's can switch faster and possess a higher power handling capacity than horizontal FET's.

Carbon nanotubes are nanoscale high-aspect-ratio cylinders of carbon atoms proposed for use in forming hybrid devices. Carbon nanotubes efficiently conduct in their conducting form and act as a semiconductor in their semiconductor form. Horizontal FET's have been fabricated using a single semiconducting carbon nanotube as a channel region and forming ohmic contacts at opposite ends of the carbon nanotube extending between a gold source electrode and a gold drain electrode situated on the surface of a substrate. A gate electrode is defined in the substrate underlying the carbon nanotube and generally between the source and drain electrodes. An oxidized exposed surface of the substrate defines a gate dielectric between the buried gate electrode and the carbon nanotube. Such horizontal FET's should switch reliably while consuming significantly less power than a comparable silicon-based device structure due to the small dimensions of the carbon nanotube. Horizontal FET's have been successfully formed under laboratory conditions by manipulating single carbon nanotubes using an atomic force microscope or coincidental placement of a single nanotube from a dispersed group of nanotubes. However, these methods of forming such horizontal FET device structures are incompatible with mass production techniques.

What is needed, therefore, is a vertical FET structure incorporating one or more semiconducting carbon nanotubes as a channel region that is compliant with mass production techniques.

SUMMARY OF THE INVENTION

In accordance with the principles of the invention, a vertical semiconductor device structure includes a substrate defining a substantially horizontal plane, a gate electrode projecting vertically from the substrate, and at least one semiconducting nanotube extending vertically through the gate electrode between opposite first and second ends. A gate dielectric, which may be disposed on the at least one semiconducting nanotube, electrically insulates the at least one semiconducting nanotube from the gate electrode. A source is electrically coupled with the first end of the at least one semiconducting nanotube and a drain is electrically coupled with the second end of the at least one semiconducting nanotube.

In another aspect of the invention, a method of forming a semiconductor device structure includes forming a conductive pad on a substrate and then growing at least one semiconducting nanotube extending substantially vertically from the conductive pad between a first end electrically coupled with the conductive pad and a second free end. The method further includes electrically insulating the at least one semiconducting nanotube with a gate dielectric and forming a gate electrode electrically insulated from and overlying the conductive pad, with the at least one semiconductor nanotube extending vertically through the gate electrode. A contact is formed that is electrically coupled with the second end of the at least one semiconducting nanotube and electrically insulated from the gate electrode.

Each semiconducting nanotube defines a channel region of a field effect transistor having a channel regulated by application of a control voltage to the gate electrode. Consistent with the principles of the invention, the length of the channel region between the source and drain is defined by the vertical dimension or thickness of the gate electrode without the limitations imposed by conventional lithographic processes used in semiconductor device fabrication to form channel regions in conventional field effect transistors.

In accordance with the principles of the invention, a semiconductor device structure includes a substrate defining a substantially horizontal plane, a conductive first plate disposed on the substrate, and at least one nanotube projecting vertically from the first plate. Each nanotube, which may have a conducting molecular structure or a semiconducting molecular structure, is electrically coupled with the first plate. Positioned vertically above the first plate and the nanotube is a conductive second plate electrically isolated from the first plate and the carbon nanotube by a dielectric layer.

In another aspect of the invention, a method of forming a semiconductor device structure includes forming a conductive first plate on a substrate and growing at least one nanotube extending substantially vertically from the first plate that is electrically coupled with the first plate. The method further includes encasing each nanotube and covering the first plate with a dielectric layer, and forming a second plate overlying said first plate that is electrically isolated by the dielectric layer from each nanotube and the first plate.

BRIEF DESCRIPTION OF THE DRAWINGS

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION OF SPECIFIC EMBODIMENTS

The invention is directed to vertical field effect transistors (FET's) that utilize carbon nanotubes as a semiconducting material for the channel region providing a selective conduction path between a source and a drain when a voltage is applied to an electrostatically-coupled gate electrode. In accordance with the principles of the invention, the length of the channel region between the source and drain is defined by the thickness of the gate electrode, which is substantially equal to the nanotube length, and is not dependent upon a resolution-limited lithographic process. The carbon nanotubes do not have to be individually manipulated for placement between a source and a drain nor does device fabrication depend upon coincidental alignment with the source and drain of one or more nanotubes randomly dispersed on the device surface.

Figure 1:
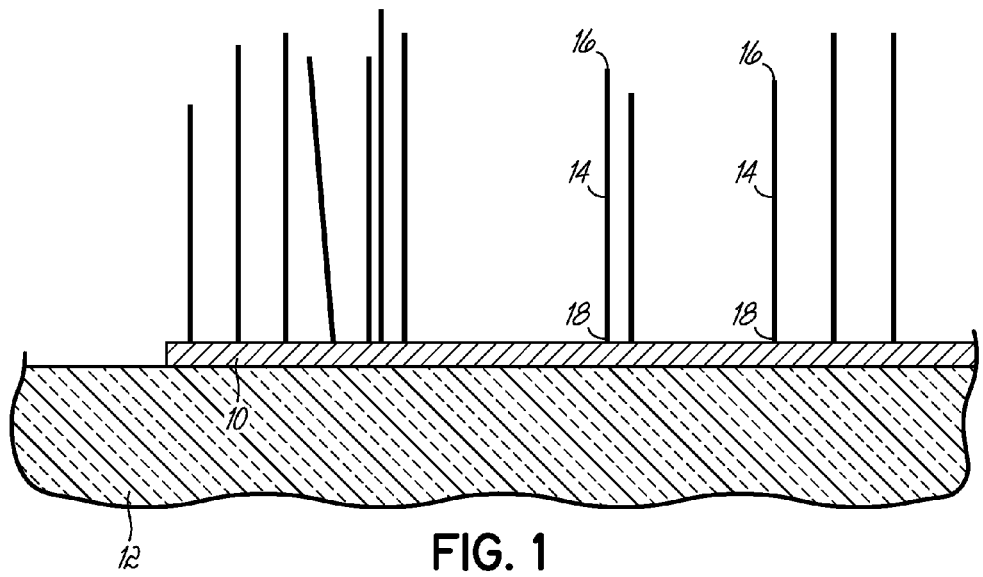
FIG. 1 is a cross-sectional view of a portion of a substrate with carbon nanotubes grown vertically on a patterned conductive catalyst pad.

With reference to FIG. 1, a catalyst pad 10 of a catalytic material suitable for supporting the growth of carbon nanotubes 14 is formed as part of a pattern of many pads 10 on a region of an insulating substrate 12. Carbon nanotubes 14 are oriented to extend substantially vertically upward from the catalyst pad 10. The insulating substrate 12 may be formed on a wafer (not shown) composed of any suitable semiconductor material, including but not limited to silicon (Si) and gallium arsenide (GaAs), upon which an insulating substrate 12, such as silicon oxide, may be formed. The catalyst pad 10 may be formed by depositing a blanket layer of the catalytic material on the insulating layer 12 by any conventional deposition technique including, but not limited to, chemical vapor deposition (CVD) using suitable precursors such as metal halides and metal carbonyls, sputtering, and physical vapor deposition (PVD) and then employing a standard lithographic and subtractive etch process to pattern the blanket layer. The catalytic material in catalyst pads 10 is any material capable of nucleating and supporting the growth of carbon nanotubes 14 when exposed to appropriate reactants under chemical reaction conditions suitable to promote nanotube growth. For example, suitable catalytic materials include, but are not limited to, iron, platinum, nickel, cobalt, compounds of each of these metals, and alloys of each of these metals such as metal silicides.

Carbon nanotubes 14 are grown on the catalytic pad 10 by any suitable growth or deposition technique. In one embodiment of the invention, the carbon nanotubes 14 are grown by chemical vapor deposition (CVD) or plasma-enhanced CVD using any suitable gaseous or vaporized carbonaceous reactant including, but not limited to, carbon monoxide (CO), ethylene ($C_2H_4$), methane ($CH_4$), acetylene ($C_2H_4$), a mixture of acetylene and ammonia ($NH_3$), a mixture of acetylene and nitrogen ($N_2$), a mixture of acetylene and hydrogen ($H_2$), xylene ($C_6H_4(CH_3)_2$), and a mixture of xylene and ferrocene ($Fe(C_5H_5)_2$) under growth conditions suitable for promoting carbon nanotube growth on the catalytic material forming the catalyst pad 10. The carbonaceous reactant and catalyst pad 10 may be heated to a temperature adequate to promote and/or hasten CVD growth. The reactant chemically reacts with the catalyst material of catalyst pad 10 to nucleate carbon nanotubes 14 and to sustain their growth after nucleation. The catalyst material of the catalyst pad 10 participates in nanotube growth without itself being transformed or consumed by the chemical reaction transpiring at its exposed surface by reducing the activation energy for the reaction forming carbon nanotubes 14 to occur.

The carbon nanotubes 14 constitute hollow cylindrical tubes composed of precisely arranged groups including hexagonal rings of bonded carbon atoms. The cylindrical tubes have a diameter ranging from about 0.5 nm to about 20 nm and a sidewall thickness of about 0.5 nm to about 3 nm. The carbon nanotubes 14 are expected to have a statistical distribution of heights or lengths each measured between a free end or leading tip 16 and a bonded end or base 18. The carbon nanotubes 14 extend on average substantially vertically upward from the catalyst pad 10 with a perpendicular or, at the least, approximately perpendicular orientation to the horizontal surface of the catalyst pad 10. The invention contemplates that one or all of the carbon nanotubes 14 may be inclined slightly from the vertical direction, as defined herein and that the nanotube orientation may be characterized by a statistical distribution that, on average, is substantially vertical. The nanotube density and spacing between adjacent carbon nanotubes 14 will depend, among other variables, upon the growth conditions. The carbon nanotubes 14 will typically grow at substantially random spatial locations on the exposed surface area of the catalyst pad 10.

Growth conditions of the CVD or plasma-enhanced CVD process are chosen for preferentially growing carbon nanotubes 14 having a semiconducting electronic structure or molecular structure. Alternatively, carbon nanotubes 14 having a semiconducting molecular structure may be preferentially selected from among a random collection of as-grown nanotubes 14 including both metallic and semiconducting molecular structures by, for example, applying a current sufficiently high to destroy nanotubes 14 having the metallic (e.g., conducting) molecular structure. Post-synthesis destruction of conducting carbon nanotubes is described in commonly-assigned U.S. Pat. No. 6,423,583, which is hereby incorporated by reference herein in its entirety. The invention also contemplates that nanotubes 14 may be composed of a material other than carbon characterized by a band gap and semiconductor properties.

The term "horizontal" as used herein is defined as a plane parallel to the conventional plane or surface of insulating substrate 12 and the underlying wafer, regardless of orientation. The term "vertical" refers to a direction perpendicular to the horizontal, as just defined. Terms, such as "on", "above", "below", "side" (as in "sidewall"), "higher", "lower", "over", and "under", are defined with respect to the horizontal plane.

Figure 2:
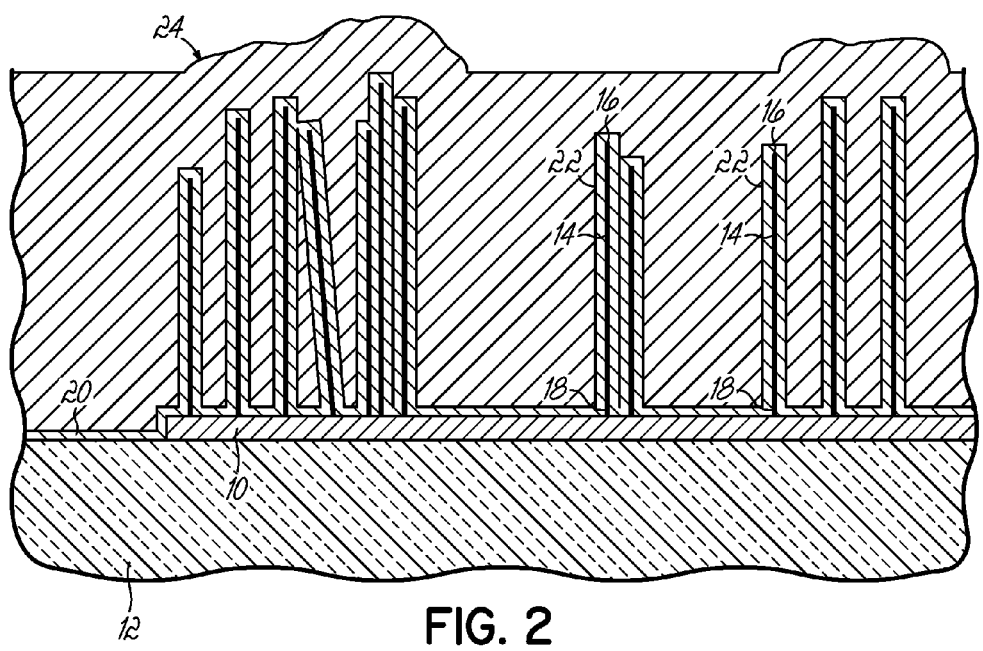
FIG. 2 is a cross-sectional view similar to FIG. 1 at a subsequent fabrication stage.

With reference to FIG. 2 in which like reference numerals refer to like features in FIG. 1, a thin dielectric layer 20 is conformally deposited on the catalyst pad 10 and the insulating substrate 12. Dielectric layer 20 may be constituted by silicon dioxide ($SiO_2$) deposited by a low pressure chemical vapor deposition (LPCVD) process using tetraethylorthosilicate (TEOS) as the silicon precursor source. The dielectric layer 20 also coats an exterior of each of the carbon nanotubes 14 along their respective height or length. Many other materials may be used instead of TEOS-based oxide, as long as electrical isolation is ensured. The coatings on the carbon nanotubes 14 will define respective gate dielectrics 22 that participate as a feature in the structure of a field effect transistor (FET) device structure, as described below.

A blanket layer 24 of a conducting material deposited on the insulating substrate 12 fills the vacant spaces between adjacent carbon nanotubes 14 and covers the nanotubes 14, insulating substrate 12, and catalyst pad 10. Blanket layer 24 is electrically isolated from the insulating substrate 12 by portions of dielectric layer 20. Suitable conducting materials for blanket layer 24 include, but are not limited to, doped polycrystalline silicon (polysilicon) and metals such as aluminum (Al), copper (Cu), gold (Au), molybdenum (Mo), tantalum (Ta), titanium (Ti), and tungsten (W). Blanket layer 24 may be deposited by any suitable deposition process such as CVD by thermal decomposition/thermolysis of a metal-containing precursor such as metal halides and metal carbonyls, PVD, or sputtering. The thickness of the blanket layer 24 should completely cover the free ends of the insulator-covered carbon nanotubes 14. Each gate dielectric 22 electrically isolates the corresponding carbon nanotube 14 from the blanket layer 24.

Figure 3:
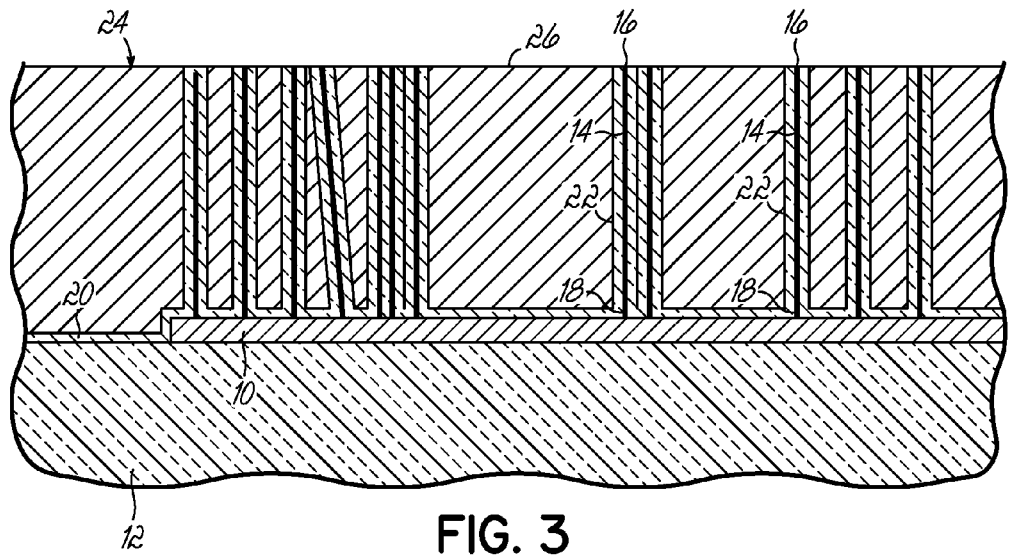
FIG. 3 is a cross-sectional view similar to FIG. 2 at a subsequent fabrication stage.

With reference to FIG. 3 in which like reference numerals refer to like features in FIG. 2, an exposed surface 26 of the blanket layer 24 is polished flat by a chemical-mechanical polishing (CMP) process or any other suitable planarization technique. Generally, CMP processes involve a polishing or mechanical abrasion action aided chemically by a slurry introduced between a polishing pad and blanket layer 24. The thickness of blanket layer 24 is reduced by removing material to a depth such that the leading tips 16 of a significant number of carbon nanotubes 14 are substantially coplanar with the exposed surface 26 and accessible for subsequent processing.

Figure 4:
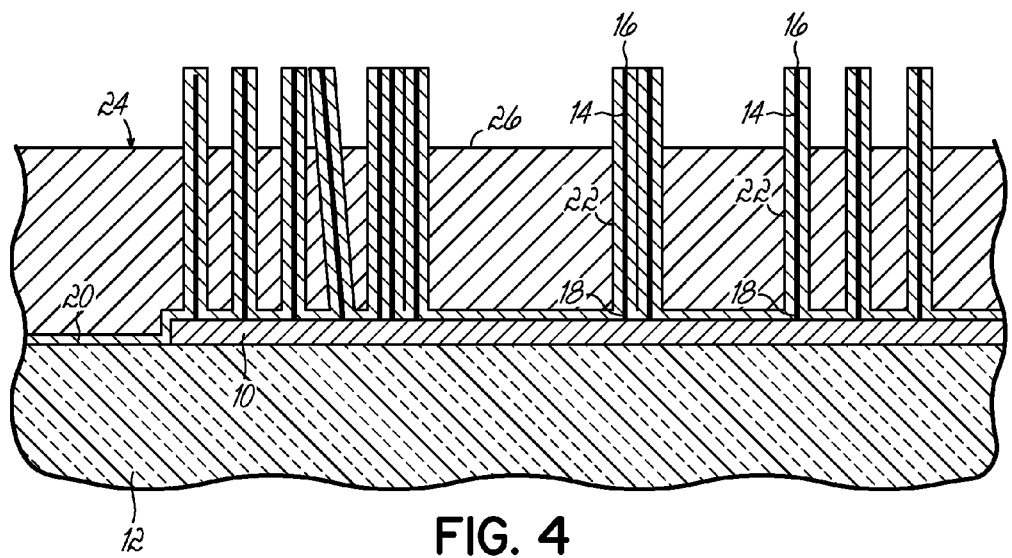
FIG. 4 is a cross-sectional view similar to FIG. 3 at a subsequent fabrication stage.

With reference to FIG. 4 in which like reference numerals refer to like features in FIG. 3, the exposed surface 26 of blanket layer 24 is removed selectively to the carbon nanotubes 14 so that the leading tips 16 project above the exposed surface 26. Techniques for recessing exposed surface 26 include reactive ion etching (RIE) and wet etching with a suitable etchant solution. For example, polysilicon or aluminum constituting blanket layer 24 may be etched by RIE using a chlorine-containing gas, a bromine-containing gas, or a mixture thereof, which is known to be selective to SiO2. The residual thickness of blanket layer 24 determines the channel length of the FET device structure.

Figure 5:
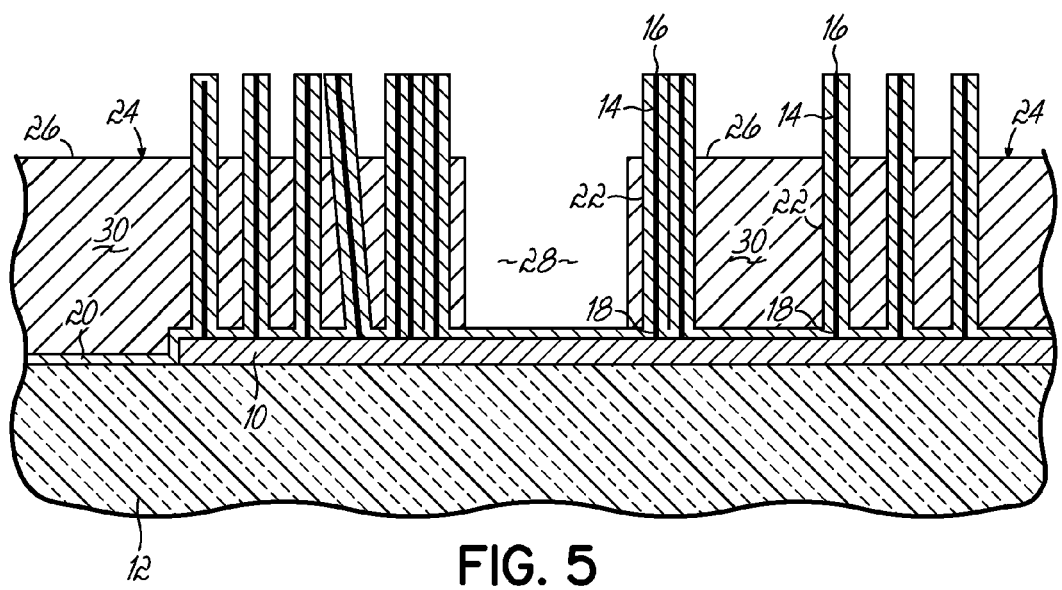
FIG. 5 is a cross-sectional view similar to FIG. 4 at a subsequent fabrication stage.
Figure 8:
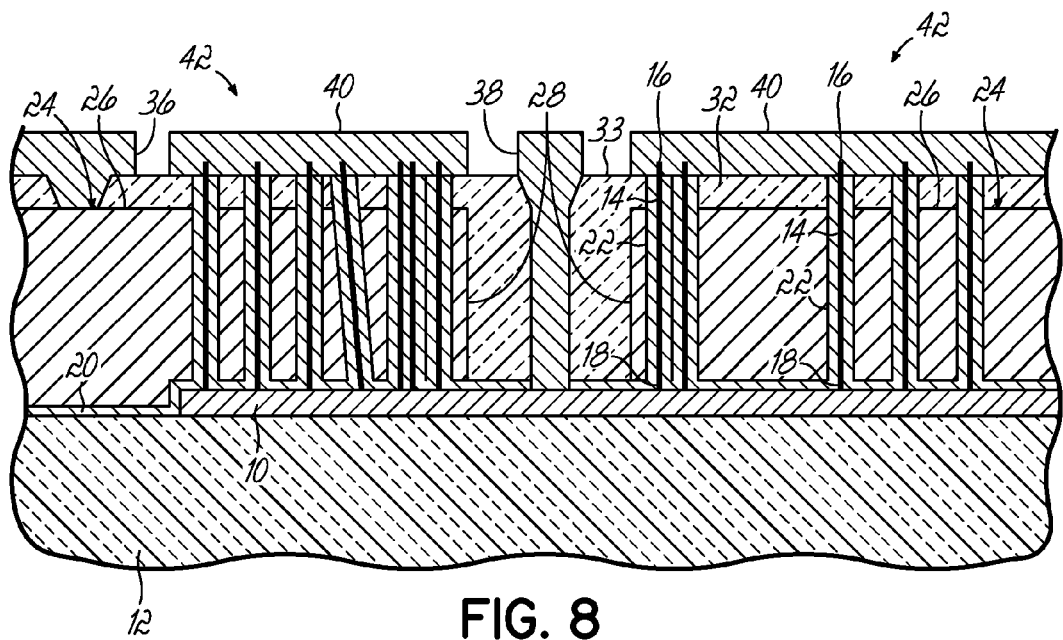
FIG. 8 is a cross-sectional view similar to FIG. 7 at a subsequent fabrication stage.

With reference to FIG. 5 in which like reference numerals refer to like features in FIG. 4, a recess 28 is formed in the blanket layer 24 that extends vertically from exposed surface 26 to the depth of dielectric layer 20. The recess 28 is formed by a standard lithographic and etch process that patterns blanket layer 24 to expose unmasked areas in which recess 28 and other similar recesses for other like device structures will be formed and masked areas, and then etched by, for example, a dry etch process using, for example, $NH_3$ to remove the conductive material in the unmasked areas. Dielectric layer 20 serves as an etch stop layer. The blanket layer 24 is also partitioned or sectioned by a standard lithographic and etch process, which may be the same lithographic and etch process forming recess 28, into individual gate electrodes 30 that define the future location of individual FET device structures 42 (FIG. 8). Any carbon nanotubes 14 that may be present in the unmasked areas of blanket layer 24 are removed by the etch process forming recess 28 or may be eliminated by any other suitable process capable of removing the carbon nanotubes 14 from recess 28. The invention contemplates that the order of the process steps described with regard to FIGS. 4 and 5 may be reversed so that the individual gate electrodes 30 are formed before the exposed surface 26 is recessed to expose the leading tips 16 of carbon nanotubes 14.

Figure 6:
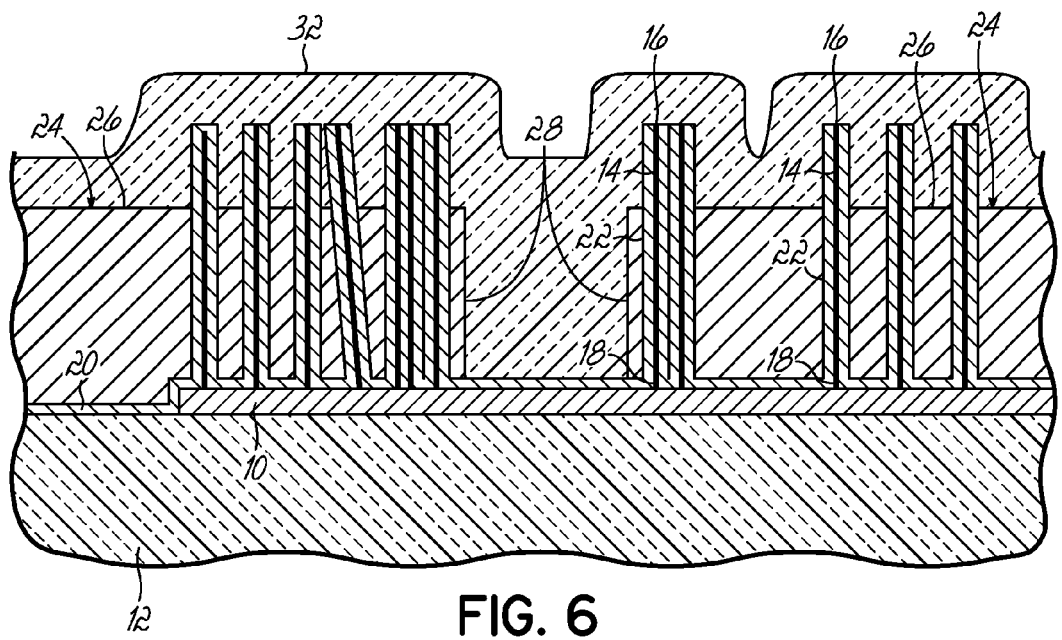
FIG. 6 is a cross-sectional view similar to FIG. 5 at a subsequent fabrication stage.

With reference to FIG. 6 in which like reference numerals refer to like features in FIG. 5, an insulating layer 32 of a dielectric material is conformally provided that fills recess 28 and covers exposed areas of blanket layer 24 to cover the leading tips 16 of carbon nanotubes 14. The insulating layer 32 may constitute, for example, silicon nitride ($Si_3N_4$) deposited using LPCVD or plasma-enhanced CVD using $NH_3$ and silane ($SiH_4$) as precursor sources or $SiO_2$, which may be deposited by a CVD process using TEOS as a precursor source. The portion of insulating layer 32 filling recess 28 electrically isolates the adjacent gate electrodes 30 from each other.

Figure 7:
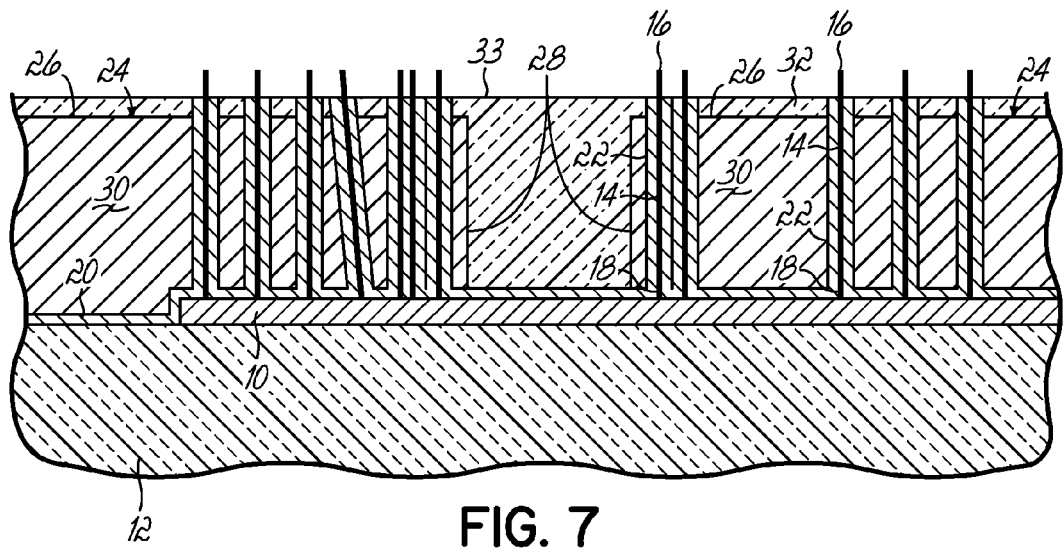
FIG. 7 is a cross-sectional view similar to FIG. 6 at a subsequent fabrication stage.

With reference to FIG. 7 in which like reference numerals refer to like features in FIG. 6, the leading tip 16 of each carbon nanotube 14 is exposed above a planar recessed exposed surface 33 of insulating layer 32 and a length of the associated gate dielectric 22 is removed therefrom. To that end, insulating layer 32 is polished flat by a CMP process or any other suitable planarization technique to define the exposed surface 33. The exposed surface 33 is then further recessed relative to the carbon nanotubes 14 using one or more RIE processes that remove insulating layer 32 and gate dielectric 22 to the depth of the recessed exposed surface 33 selective to the carbon nanotubes 14. Alternatively, a wet etch process using a suitable etchant solution, such as a buffered hydrofluoric acid (HF) solution, may be used. The carbon nanotubes 14 may have a distribution of lengths and although not shown, certain carbon nanotubes 14 may remain buried in the insulating layer 32 and/or the gate electrodes 30 after the exposed surface 33 is recessed.

With reference to FIG. 8 in which like reference numerals refer to like features in FIG. 7, gate contacts 36 and source contacts 38 are formed by defining contact openings in insulating layer 32 at appropriate locations with a standard lithographic and etch process and filling the contact openings with a conductive material. The lithographic and etch process also defines areas of conductive material that operate as drain contacts 40. Each gate contact 36 is electrically coupled, preferably ohmically, with one of the gate electrodes 30 and each source contact 38 is electrically coupled, preferably ohmically, with one of the catalytic pads 10. Each drain contact 40 is electrically coupled, preferably ohmically, with the leading tips 16 of carbon nanotubes 14 extending through the associated one of the gate electrodes 30. Contacts 36, 38 and 40 are electrically isolated from each other and are formed from any suitable conducting materials including, but not limited to, Au, Al, Cu, Mo, Ta, Ti, and W deposited by, for example, CVD, PVD or sputtering. Standard back-end-of-the-line (BEOL) processing is used to fabricate and couple an interconnect structure linking contacts 36, 38 and 40 with corresponding contacts of adjacent FET's.

The completed device structure 42 forms an FET having a gate or gate region defined by one of the gate electrodes 30, a source or source region defined by catalyst pad 10 and source contact 38, a drain or drain region defined by drain contact 40, a semiconducting channel region defined collectively along the length of the carbon nanotubes 14 extending through the associated gate electrode 30 with a vertical orientation relative to the horizontal plane of the insulating substrate 12, and a gate dielectric defined by each of the individual gate dielectrics 22 covering the nanotubes 14. Although only two completed device structures 42 are visible in FIG. 8, it is understood that multiple replicas of structure 42 are provided on insulating substrate 12 as detailed herein. Each completed device structure 42 is electrically coupled for device operation with additional circuit components (not shown) supported on adjacent regions of the insulating substrate 12. Carriers flow selectively from the catalyst pad 10 through the carbon nanotubes 14 to the drain contact 40 when an electrical voltage is either applied via the corresponding gate contact 36 to one of the gate electrodes 30 to create a channel in the carbon nanotubes 14 extending therethrough. The invention contemplates that, in certain embodiments, the catalyst pad 10 and source contact 38 may serve as a drain region and drain contact 40 may act as a source region.

Figure 9:
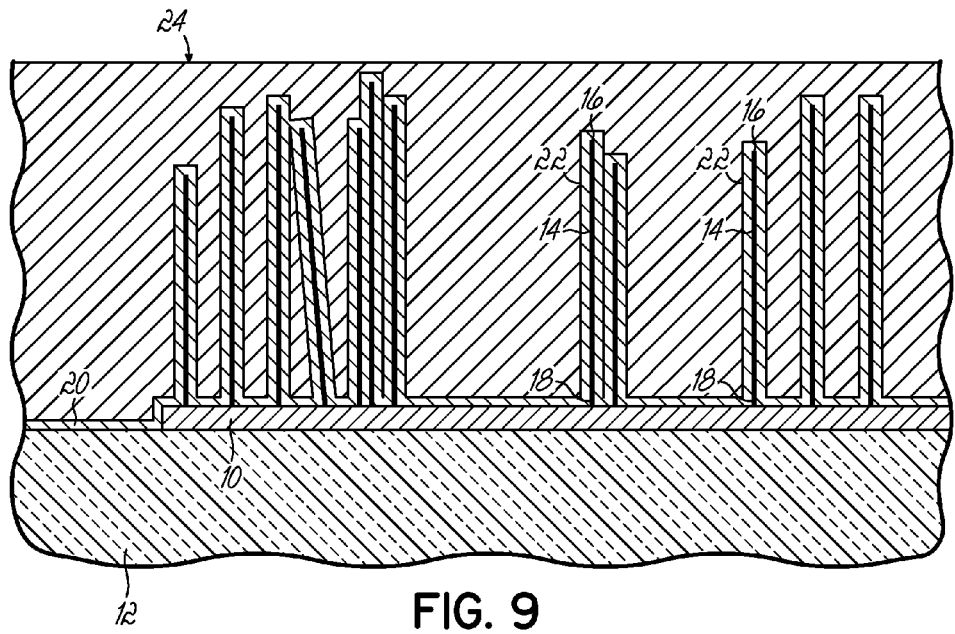
FIG. 9 is a cross-sectional view similar to FIG. 2 at a subsequent fabrication stage in accordance with an alternative embodiment of the invention.
Figure 10:
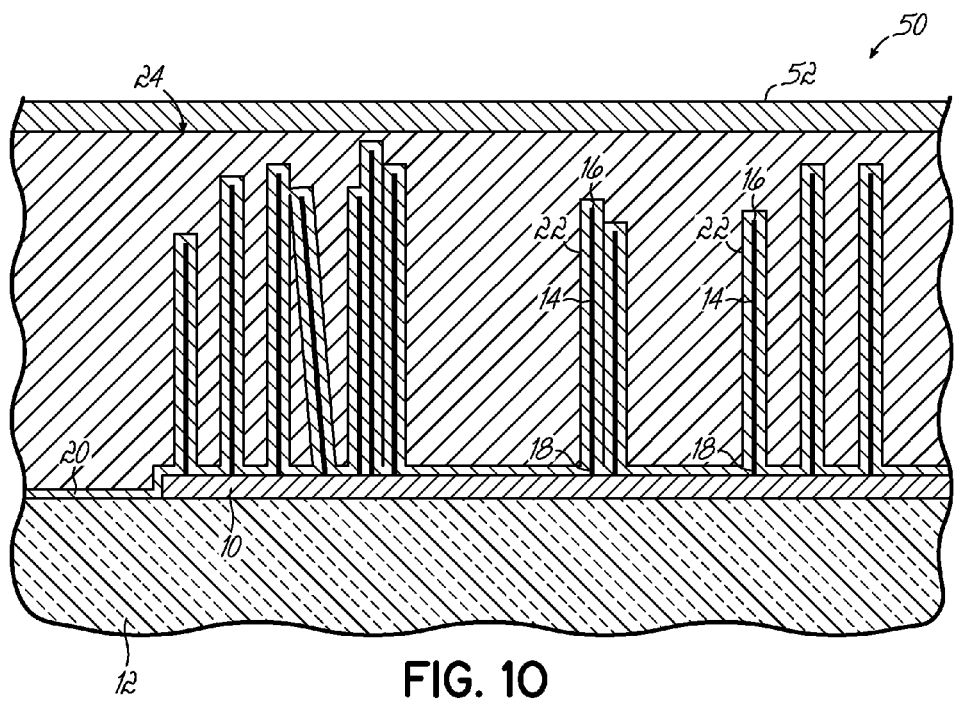
FIG. 10 is a cross-sectional view similar to FIG. 9 at a subsequent fabrication stage.

With reference to FIGS. 9 and 10 in which like reference numerals refer to like features in FIGS. 1 and 2 and in accordance with an alternative embodiment of the invention, a capacitor device structure 50 (FIG. 10) may be formed by a different set of processing steps performed subsequent to the device fabrication stage illustrated in FIG. 2. Specifically, the blanket layer 24 of a conducting material is planarized to a depth that is above the dielectric-covered leading tips 16 of the carbon nanotubes 14 and a layer 52 of conducting material is applied to the planarized blanket layer 24. A contact (not shown) is electrically coupled with the catalyst pad 10 so that the catalyst pad 10 and the carbon nanotubes 14 supply one electrode or plate of the capacitor device structure 50 and the layer 52 supplies the opposite electrode or plate of the capacitor device structure 50. Dielectric layer 20 electrically isolates the two plates. The presence of the carbon nanotubes 14, which are covered by the dielectric layer 20, increases the effective surface area of one of the plates.

As the carbon nanotubes 14 are semiconducting, a superimposed constant bias voltage must be applied to the plates of the capacitor device structure 50 so that the carbon nanotubes 14 conduct current. In an alternative embodiment of the invention, the carbon nanotubes 14 may be grown under growth conditions suitable to provide the conducting molecular structure so that the constant bias voltage is not required.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method of forming a semiconductor device structure, the method comprising:
    forming a conductive pad on a substrate;
    growing at least one semiconducting nanotube extending substantially vertically from the conductive pad between a first end electrically coupled with the conductive pad and a second free end;
    applying a first insulating layer on the conductive pad and the at least one semiconducting nanotube such that a portion of the first insulating layer defines a gate dielectric on the at least one semiconducting nanotube;
    applying a conductive layer on the first insulating layer and the at least one semiconducting nanotube;
    patterning the conductive layer to form a gate electrode electrically insulated from the conductive pad by the first insulating layer and overlying the conductive pad with the at least one semiconducting nanotube extending vertically through an aperture in the gate electrode and electrically isolated from the gate electrode by the gate dielectric; and
    forming a contact electrically coupled with the second end of the at least one semiconducting nanotube and electrically insulated from the gate electrode.

2. The method of claim 1 wherein electrically insulating the at least one semiconducting nanotube comprises:
    encasing the at least one semiconducting nanotube inside the gate dielectric.

3. The method of claim 1 wherein forming the contact comprises:
    removing the gate dielectric from the free end of the at least one semiconducting nanotube; and
    providing a metal feature operating as said contact.

4. The method of claim 3 further comprising:
    forming a second insulating layer on the gate electrode; and
    recessing the second insulating layer and the gate dielectric to expose the free end of the at least one semiconducting nanotube.

5. The method of claim 1 wherein the at least one semiconducting nanotube is a carbon nanotube and the conductive pad is formed of a catalyst material suitable for growing carbon nanotubes, and growing the at least one semiconducting nanotube further comprises:
    exposing the conductive pad to a carbonaceous reactant under conditions effective to incorporate carbon atoms into the carbon nanotube with a semiconducting molecular structure.

6. The method of claim 1 wherein growing the at least one semiconducting nanotube further comprises:
    growing the at least one semiconducting nanotube by a chemical vapor deposition technique.

7. The method of claim 1 wherein the free end of the at least one semiconducting nanotube projects into a metal constituting the contact.

8. The method of claim 1 wherein the at least one semiconducting nanotube is characterized by arranged carbon atoms.

9. The method of claim 1 wherein the at least one semiconducting nanotube defines a channel region of a field effect transistor having a channel regulated by application of a control voltage to the gate electrode.

10. The method of claim 1 wherein forming the contact comprises:
    partially removing the gate dielectric from the second end of the at least one semiconducting nanotube to expose the second end of the at least one semiconducting nanotube.

11. The method of claim 10 further comprising:
providing a metal feature operating as said contact electrically coupled with the second end of the at least one semiconducting nanotube.

12. The method of claim 1 wherein said at least one semiconducting nanotube defines a channel region of a field effect transistor having a channel along which current flow is regulated by application of a control voltage to said gate electrode.

13. A method of forming a semiconductor device structure, the method comprising:
forming a conductive first plate on a substrate;
growing at least one nanotube extending substantially vertically from the first plate that is electrically coupled with the first plate;
covering the at least one nanotube and the first plate with a dielectric layer such that the at least one nanotube is encased inside the dielectric layer and a leading tip of the at least one nanotube is covered by a portion of the dielectric layer; and
depositing a blanket layer of a conducting material on the dielectric layer that is electrically insulated by the dielectric layer from the at least one nanotube and the first plate.

14. The method of claim 13 wherein said at least one nanotube has a conducting molecular structure.

15. The method of claim 13 wherein said at least one nanotube has a semiconducting molecular structure.

16. The method of claim 13 further comprising:
planarizing the conductive material of the blanket layer to a depth that is above the dielectric-covered leading tip of the at least one carbon nanotube.

17. The method of claim 13 further comprising:
forming a conductive second plate on the planarized conductive material of the blanket layer.

* * * * *